United States Patent
Harayama et al.

(10) Patent No.: US 8,400,611 B2
(45) Date of Patent: Mar. 19, 2013

(54) SCANNING EXPOSURE APPARATUS AND DEVICE MANUFACTURING METHOD

(75) Inventors: Tomohiro Harayama, Utsunomiya (JP); Takashi Meguro, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 573 days.

(21) Appl. No.: 12/620,376

(22) Filed: Nov. 17, 2009

(65) Prior Publication Data

US 2010/0123891 A1 May 20, 2010

(30) Foreign Application Priority Data

Nov. 18, 2008 (JP) ................. 2008-294905

(51) Int. Cl.
*G03B 27/68* (2006.01)
*G03B 27/42* (2006.01)

(52) U.S. Cl. .......................... 355/52; 355/53
(58) Field of Classification Search .................... 355/52, 355/53, 72, 75, 67
See application file for complete search history.

(56) References Cited

U.S. PATENT DOCUMENTS

| 6,335,784 B2 | 1/2002 | Mishima |
| 2004/0257549 A1 * | 12/2004 | Leenders et al. ................. 355/53 |
| 2005/0151946 A1 * | 7/2005 | Van Der Biggelaar et al. 355/53 |
| 2009/0268185 A1 * | 10/2009 | Vervoordeldonk et al. ..... 355/68 |

FOREIGN PATENT DOCUMENTS

| JP | 7-135158 A | 5/1995 |
| JP | 9-199386 A | 7/1997 |
| JP | 11-045846 A | 2/1999 |
| JP | 2003-031646 A | 1/2003 |
| JP | 2004-079671 A | 3/2004 |
| JP | 2007-173323 A | 7/2007 |
| JP | 2008-270491 A | 11/2008 |

* cited by examiner

*Primary Examiner* — Peter B Kim
(74) *Attorney, Agent, or Firm* — Canon U.S.A, Inc. IP Division

(57) ABSTRACT

An apparatus including an original stage that holds an original, a substrate stage that holds a substrate, and a projection optical system that projects a pattern of the original onto the substrate, and being configured to scan and expose the substrate during a period in which the speeds of the original stage and the substrate stage change, comprises a controller configured to correct, a distortion generated in an image transferred onto the substrate due to at least one of deformation of the original stage in response to a change in speed of the original stage and deformation of the substrate stage in response to a change in speed of the substrate stage, based on a correction value determined by an acceleration of the substrate stage.

8 Claims, 6 Drawing Sheets

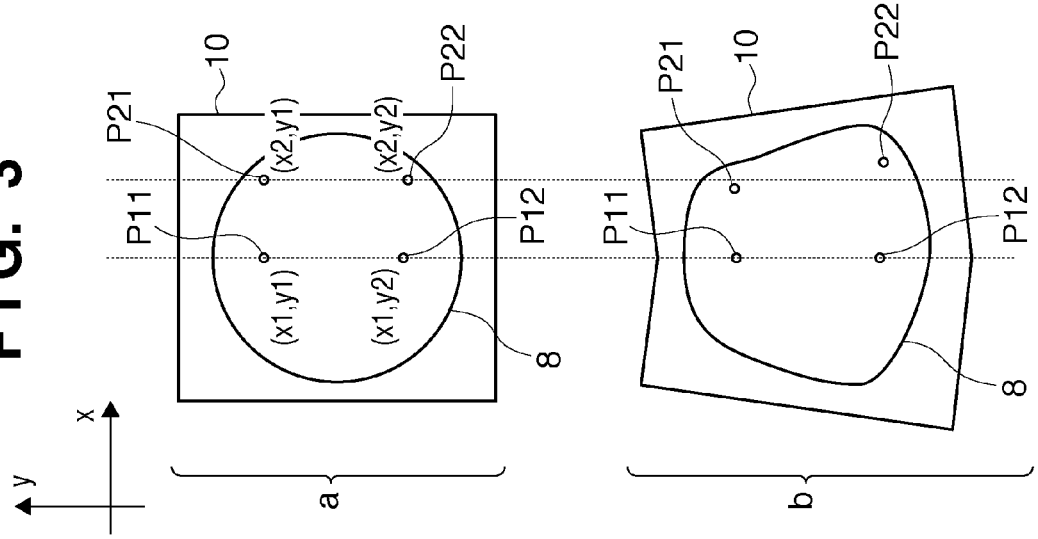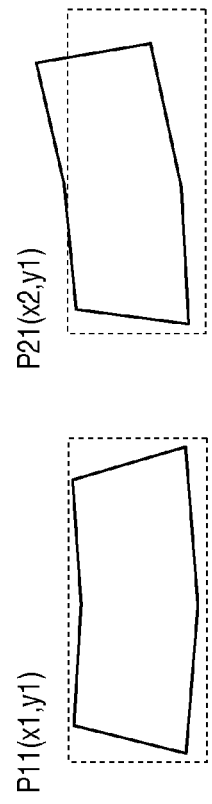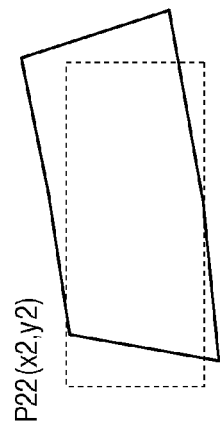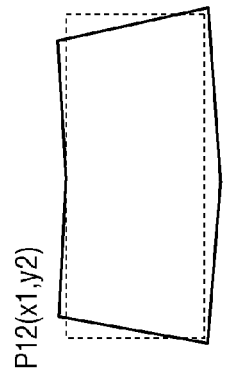

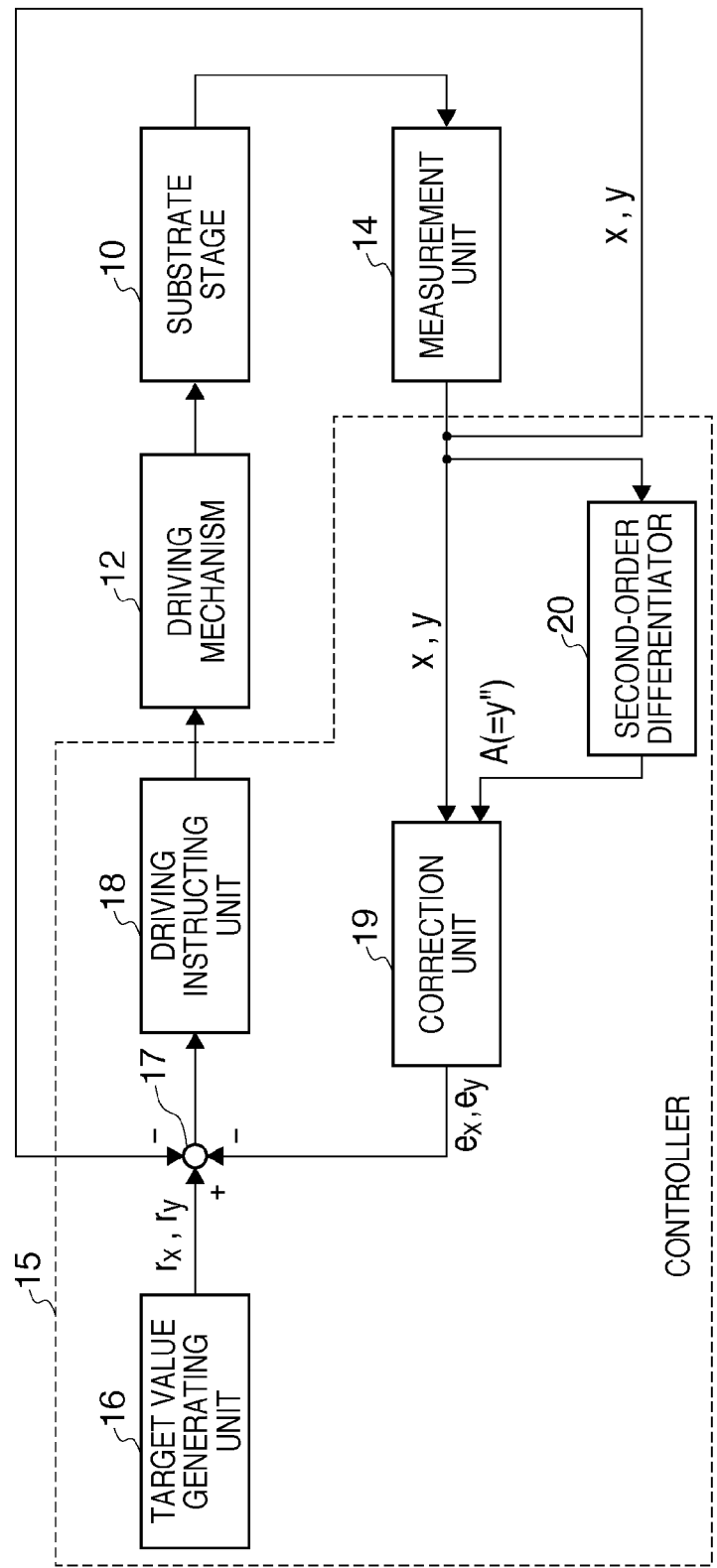

SCANNING EXPOSURE APPARATUS AND DEVICE MANUFACTURING METHOD

BACKGROUND OF THE INVENTION

1. Field of the Invention

The present invention relates to a scanning exposure apparatus and a method of manufacturing a device using the scanning exposure apparatus.

2. Description of the Related Art

A scanning exposure apparatus generally scans at a constant speed during the exposure period for the following two reasons. First, the exposure dose on a substrate (e.g., a wafer or a glass plate) is maintained constant when the exposure rate on the substrate is constant. Second, the scanning exposure apparatus is less prone to vibrate upon stage driving as long as it has a constant speed (i.e., zero acceleration).

In recent years, an exposure apparatus is expected to achieve both a high resolution and a high productivity. As one solution to meet this demand, Japanese Patent Laid-Open No. 7-135158 discloses a scheme of exposing a substrate not only during the period in which the scanning speed stays constant but also during the acceleration and deceleration periods. This scheme adjusts the exposure rate in accordance with the scanning speed during exposure, thereby allowing exposure during acceleration/deceleration free from any exposure variation, i.e., allowing an improvement in throughput.

Japanese Patent Laid-Open No. 9-199386 discloses a technique of correcting, an image shift attributed to an orientation error, decentering, or vibration of a projection optical system, or pitching of a mask stage each upon driving the mask stage, in accordance with the scanning position and acceleration of the mask stage during exposure.

To improve the throughput, one scheme is to scan and expose a substrate not only during the period in which the speeds of an original stage and a substrate stage are controlled constant but also during the period in which the speeds of the original stage and the substrate stage change.

However, the deformations of the original stage and substrate stage attributed to changes in speed of the original stage and substrate stage are non-negligible. As the original stage and the substrate stage deform, the original and the substrate on them, in turn, deform. This results in a distortion of an image transferred onto the substrate on the substrate stage.

Japanese Patent Laid-Open No. 9-199386 neither discloses nor suggests a technique of correcting a distortion generated in an image transferred onto the substrate due to the deformations of the original stage and substrate stage.

SUMMARY OF THE INVENTION

One of the aspects of the present invention provides an apparatus which includes an original stage that holds an original, a substrate stage that holds a substrate, and a projection optical system that projects a pattern of the original onto the substrate, and which scans and exposes the substrate during a period in which the speeds of the original stage and the substrate stage change, the apparatus comprising a controller configured to correct, a distortion generated in an image transferred onto the substrate due to at least one of deformation of the original stage in response to a change in speed of the original stage and deformation of the substrate stage in response to a change in speed of the substrate stage, based on a correction value determined by an acceleration of the substrate stage.

Further features of the present invention will become apparent from the following description of exemplary embodiments with reference to the attached drawings.

BRIEF DESCRIPTION OF THE DRAWINGS

FIG. 3 is a schematic plan view showing a substrate and the substrate stage which holds it when seen from above;

FIGS. 4A to 4D are views illustrating the deformations of the substrate at points P11, P12, P21, and P22 shown in FIG. 3;

FIG. 5 is a block diagram showing the configuration of a substrate stage control system in the scanning exposure apparatus according to the first embodiment of the present invention;

DESCRIPTION OF THE EMBODIMENTS

Embodiments of the present invention will be described below with reference to the accompanying drawings.

Figure 1:
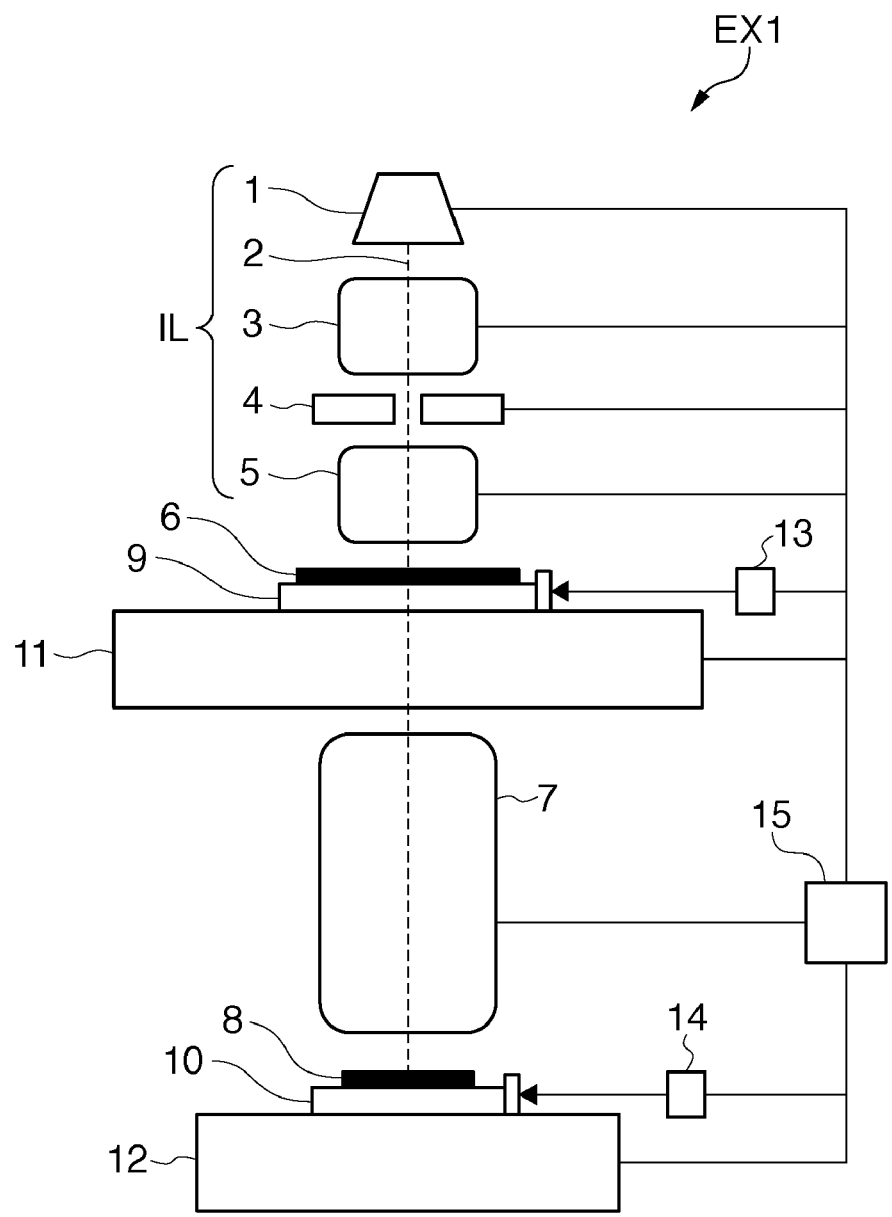
FIG. 1 is a view showing the schematic arrangement of a scanning exposure apparatus according to the first embodiment of the present invention.

FIG. 1 is a view showing the schematic arrangement of a scanning exposure apparatus according to the first embodiment of the present invention. A scanning exposure apparatus EX1 includes an illumination system IL, original stage driving mechanism 11, projection optical system 7, substrate stage driving mechanism 12, measurement units 13 and 14, and controller 15. The illumination system IL includes, for example, a light source 1, front-side illumination optical system 3, aperture stop 4, and rear-side illumination optical system 5. The original stage driving mechanism 11 drives an original stage 9 which holds an original 6. The projection optical system 7 projects an image of the pattern of the original 6 onto a substrate 8 held by a substrate stage 10.

The substrate stage driving mechanism 12 drives the substrate stage 10. The measurement unit (e.g., a laser interferometer) 13 measures the position, rotation, and tilt of the original stage 9. The measurement unit (e.g., a laser interferometer) 14 measures the position, rotation, and tilt of the substrate stage 10. The controller 15 controls the illumination system IL, measurement unit 13, original stage driving mechanism 11, projection optical system 7, substrate stage driving mechanism 12, and measurement unit 14.

A light beam 2 emitted by the light source 1 impinges on the original 6 via the front-side illumination optical system 3, aperture stop 4, and rear-side illumination optical system 5 to illuminate the original 6. The pattern of the original 6 is projected onto the substrate 8 by the projection optical system 7 to expose the substrate 8. The substrate 8 is coated with a resist (photosensitive material). A latent image is formed on the resist by exposure. The formed latent image is visualized into a physical pattern, i.e., a resist pattern by a development process. In this specification, that a latent image is formed on the resist applied on the substrate 8 will be expressed as "an image or a pattern is transferred".

During exposure of the substrate 8, the original 6 and substrate 8 are scanned with respect to the projection optical system 7. The original 6 is scanned by driving the original stage 9 by the original stage driving mechanism 11 based on the result of measurement of the position of the original stage 9 by the measurement unit 13 under the control of the controller 15. The substrate 8 is scanned by driving the substrate stage 10 by the substrate stage driving mechanism 12 based on the result of measurement of the position of the substrate stage 10 by the measurement unit 14 under the control of the controller 15.

The scanning exposure apparatus EX1 is configured to scan and expose the substrate 8 not only during the period in which the speeds of the original stage 9 and substrate stage 10 are controlled constant but also during the period in which the speeds of the original stage 9 and substrate stage 10 change.

Figure 2:
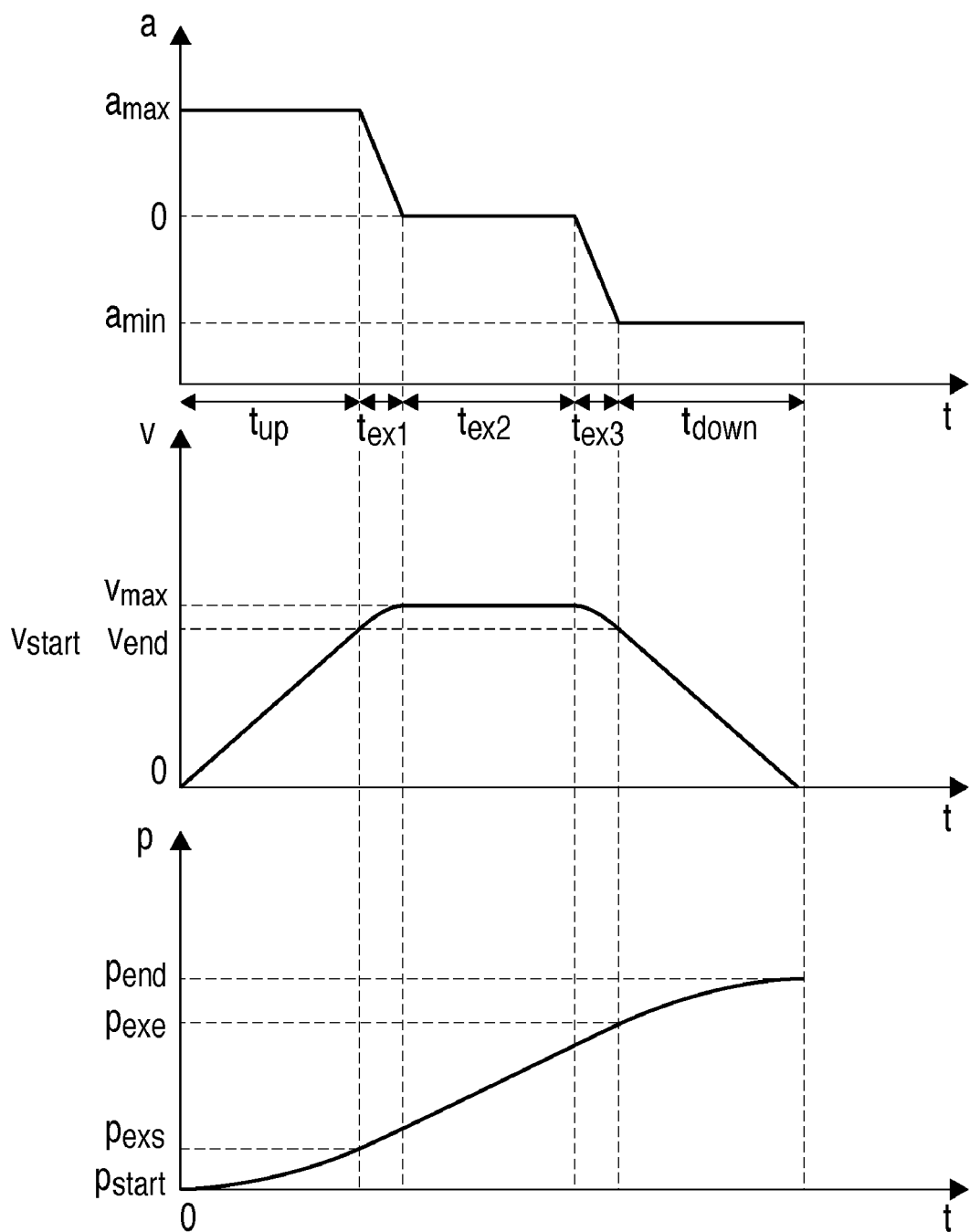
FIG. 2 is a graph illustrating the acceleration, scanning velocity, and position of a substrate stage in scanning exposure.

FIG. 2 is a graph illustrating the acceleration, scanning velocity, and position of the substrate stage 10 in scanning exposure. Note that since the substrate stage 10 and original stage 9 are scanned synchronously, the acceleration, scanning velocity, and position of the original stage 9 are the same as in FIG. 2, except for a difference in the values indicated by the respective ordinates.

During an interval $t_{up}$, the substrate 8 is not exposed, and the substrate stage 10 accelerates at a maximum acceleration ($a_{max}$). During intervals $t_{ex1}$, $t_{ex2}$, and $t_{ex3}$, the substrate 8 is exposed. During an interval $t_{down}$, the substrate 8 is not exposed, and the substrate stage 10 decelerates at a negative maximum acceleration ($a_{min}$). That is, in this embodiment, the acceleration of the substrate stage 10 changes from $a_{max}$ to $a_{min}$ during the scanning exposure time duration.

FIG. 3 is a schematic plan view showing the substrate 8 and the substrate stage 10 which holds it when seen from above. The substrate 8 and substrate stage 10 are scanned in the y direction. Reference symbol a in FIG. 3 denotes the state in which the speed of the substrate 8 and substrate stage 10 stays constant (during the interval t $t_{ex2}$). Reference symbol b in FIG. 3 denotes the state in which the substrate 8 and substrate stage 10 have been driven at a maximum acceleration in the +y direction (at the start time of the interval $t_{ex1}$) as an example of the state in which there is no change in speed (the state in which the acceleration is nonzero). Coordinate positions (x1, y1), (x1, y2), (x2, y1), and (x2, y2) of points P11, P12, P21, and P22, match the vertices of a rectangle when there is no change in speed. When there is change in speed, the coordinate positions (x1, y1), (x1, y2), (x2, y1), and (x2, y2) change in accordance with the acceleration of the substrate stage 10. In other words, the substrate stage 10 deforms in accordance with its acceleration. Similarly, the original stage 9 deforms in accordance with its acceleration.

The amounts of displacement of the two points P11(x1, y1) and P12(x1, y2) (the amounts of displacement from their original positions) having an x-coordinate relatively close to the center of the substrate stage 10 are likely to be small. In contrast to this, the amounts of displacement of the two points P21(x2, y1) and P22(x2, y2) having an x-coordinate relatively far from the center of the substrate stage 10 are likely to be large. Furthermore, the difference in displacement between two points having different y-coordinates is as follows. The point P21(x2, y1) on the +y side is displaced in the −x direction, whereas the point P22(x2, y2) on the −y side is displaced in the +x direction.

Although not shown, respective portions on each of the substrate stage 10 and original stage 9 may be displaced not only in the x and y directions but also in the z direction, the rotation direction, and the tilt direction due to the deformations of the substrate stage 10 and original stage 9.

The deformations of the original stage 9 and substrate stage 10, in turn, deform moving mirrors serving as the measurement target surfaces of laser interferometers functioning as the measurement units 13 and 14. This leads to measurement errors of the positions, rotations, and tilts of the original stage 9 and substrate stage 10.

As the substrate stage 10 deforms in response to a change in its speed (due to factors associated with a positive or negative acceleration) during scanning exposure, the substrate 8 may, in turn, deform. Also, as the original stage 9 deforms in response to a change in its speed during scanning exposure, the original 6 may, in turn, deform. Hence, an image transferred onto the substrate 8 may be distorted due to at least one of the deformation of the original 6 in response to a change in speed of the original stage 9, and that of the substrate 8 in response to a change in speed of the substrate stage 10. The deformation of the original 6 distorts an image itself projected onto the substrate 8 by the projection optical system 7. The deformation of the substrate 8 does not distort an image itself projected onto the substrate 8 by the projection optical system 7. Instead, this deformation distorts the image transferred onto the substrate 8 (the latent image formed on the substrate 8) when the deformation of the substrate 8 vanishes as the acceleration becomes zero.

FIGS. 4A to 4D are views illustrating the deformations of the substrate at the points P11, P12, P21, and P22 shown in FIG. 3. Each dotted line indicates the exposure target region to be exposed to slit light when the substrate has not deformed (when the acceleration is zero). Each solid line schematically indicates the exposure target region when the substrate has deformed (when the acceleration is nonzero). At the point P11, a region wider than the exposure target region is exposed to slit light because the substrate deforms in the direction in which it shrinks. When the deformation of the substrate vanishes as the substrate stops, an image larger than the targeted image is transferred onto the substrate.

It is possible to calculate the amount of deformation of the substrate stage 10, and the amount of deformation of the substrate 8 dependent on it by, for example, simulation. First, the substrate stage 10 and the substrate 8 held by it are modeled by mechanical deformation simulation to calculate the amounts of displacement of evaluation target points on the substrate stage 10 and substrate 8 upon accelerating the substrate stage 10. A system which calculates the rotation and tilt of the substrate stage 10 based on the measurement values obtained at two points on a moving mirror (the measurement target surface of a laser interferometer) also calculates rotation and tilt errors attributed to the deformation of the moving mirror. The amounts of displacement of evaluation points on the substrate stage 10 and substrate 8 can be obtained as a function of acceleration by performing the same calculation while changing their acceleration.

Based on the above-mentioned calculation result, measurement errors ($e_x$: an error in the x direction; $e_y$: an error in the y direction; $e_z$: an error in the z direction; $e_{yaw}$: a rotation error; and $e_{pitch}$: a tilt error) can be calculated as functions of coordinates x and y and an acceleration A of the substrate stage 10 in accordance with:

$$e_x = f_x(x,y,A)$$

$$e_y = f_y(x,y,A)$$

$$e_z = f_z(x,y,A)$$

$$e_{yaw} = f_x(x,y,A)$$

$$e_{pitch} = f_x(x,y,A) \qquad (1)$$

Note that the acceleration A is the second-order derivative ($d^2y/dt^2$) of y, assuming that the scanning direction of a substrate stage in a scanning exposure apparatus is the y direction. The controller 15 controls the position, rotation, and tilt of the substrate stage 10 using, as correction values, the measurement errors $e_x$, $e_y$, $e_z$, $e_{yaw}$, and $e_{pitch}$ determined based on the position (x, y) and acceleration A of the substrate stage 10. This makes it possible to correct a distortion of an image, transferred onto the substrate 8, attributed to the deformation of the substrate stage 10 in response to a change in its speed. Note that when the sensitivities of the correction values to the position (x, y) of the substrate stage 10 are lower than a tolerance, the correction values may be given as functions of only the acceleration A. Note also that the accelerations of the substrate stage 10 and original stage 9 are proportional to the projection magnification in the projection optical system 7. Hence, a function of the acceleration A of the substrate stage 10 can also be the function of the acceleration A of the original stage 9.

To additionally take into consideration the acceleration in the x direction, equations (1) are to be substituted by:

$$e_x = f_x(x,y,x'',y'')$$

$$e_y = f_y(x,y,x'',y'')$$

$$e_z = f_z(x,y,x'',y'')$$

$$e_{yaw} = f_x(x,y,x'',y'')$$

$$e_{pitch} = f_x(x,y,x'',y'') \quad (2)$$

Note that $x'' = d^2x/dt^2$ and $y'' = d^2y/dt^2$.

Further, the measurement errors $e_x$, $e_y$, $e_z$, $e_{aw}$, and $e_{pitch}$ may be modified by taking account of a distortion of an image, transferred onto the substrate 8, attributed to the deformation of the original stage 9. The controller 15 can control the position, rotation, and tilt of the substrate stage 10 using, as correction values, the modified measurement errors $e_x$, $e_y$, $e_z$, $e_{yaw}$, and $e_{pitch}$ determined based on the position (x, y) and acceleration A of the substrate stage 10. This makes it possible to correct a distortion of an image, transferred onto the substrate 8, attributed to the deformation of the original stage 9 in response to a change in its speed, and that of the substrate stage 10 in response to a change in its speed.

FIG. 5 is a block diagram showing the configuration of a substrate stage control system in the scanning exposure apparatus EX1 according to the first embodiment of the present invention. For the sake of descriptive simplicity, FIG. 5 shows control of only the positions x and y in the x and y directions, respectively, of the substrate stage 10. However, the position z in the z direction, the rotation yaw about the z-axis, and the rotation pitch about the x-axis of the substrate stage 10 can typically be controlled as well.

In the example shown in FIG. 5, the controller 15 can include a target value generating unit 16, computing unit 17, driving instructing unit 18, correction unit 19, and second-order differentiator 20. The target value generating unit 16 generates target positions $r_x$ and $r_y$ in the x and y directions, respectively, of the substrate stage 10 as the target values. The computing unit 17 computes a deviation between the target positions $r_x$ and $r_y$ and the current positions x and y. In addition, the computing unit 17 modifies the deviation using the correction values $e_x$ and $e_y$, and provides the modified deviation to the driving instructing unit 18. The driving instructing unit 18 issues a driving instruction in accordance with the modified deviation, and sends it to the substrate stage driving mechanism 12. The substrate stage driving mechanism 12 drives the substrate stage 10 in accordance with the driving instruction received from the substrate stage driving mechanism 12.

The measurement unit 14 measures the current positions x and y of the substrate stage 10, and provides the measurement results to the computing unit 17, correction unit 19, and second-order differentiator 20. The second-order differentiator 20 calculates the second-order derivative of the current position y (both the current positions x and y when the acceleration in the x direction perpendicular to the scanning direction is taken into consideration), and outputs the acceleration A (y" in this case). The correction unit 19 computes the correction values $e_x$ and $e_y$ in accordance with equations (1), and provides the computation results to the computing unit 17.

As described above, a distortion of an image transferred onto the substrate is corrected in accordance with the acceleration of the substrate stage 10. With this operation, a high-quality image can be transferred onto the substrate by scanning and exposing the substrate even if the speed of the substrate stage 10 changes. This makes it possible to improve the throughput while maintaining a given quality of an image transferred onto the substrate.

Figure 6:
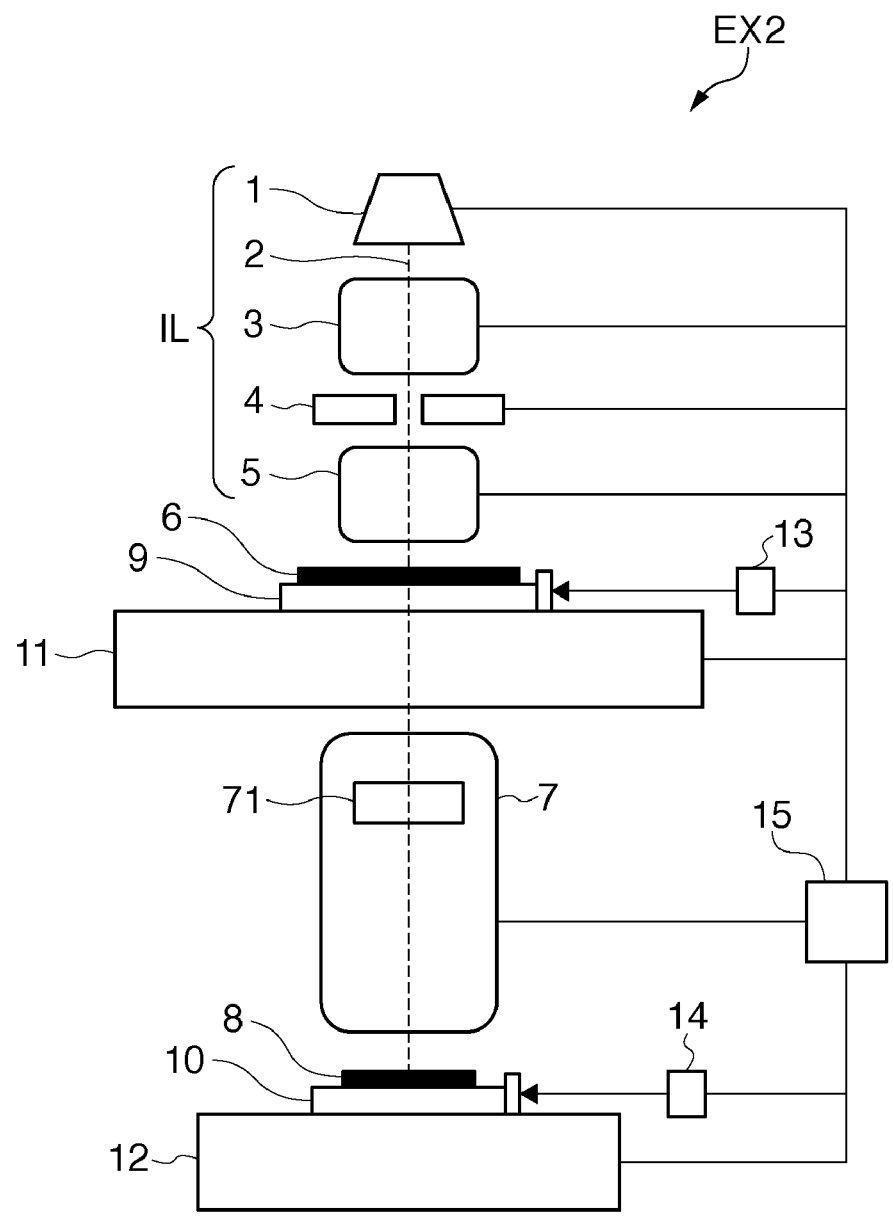
FIG. 6 is a view showing the schematic arrangement of a scanning exposure apparatus according to the second embodiment of the present invention.

FIG. 6 is a view showing the schematic arrangement of a scanning exposure apparatus EX2 according to the second embodiment of the present invention. Note that details which are not particularly referred to in the second embodiment can be the same as in the first embodiment.

As described above, as a substrate stage 10 deforms, a substrate 8, in turn, deforms. This results in a distortion of the image transferred when the deformation of the substrate 8 vanishes. Similarly, as an original stage 9 deforms, an original 6, in turn, deforms. This results in a distortion of an image itself projected onto the substrate 8.

A distortion, of an image formed on the substrate 8, generated by the above-mentioned mechanism may differ depending on the position within the plane of the substrate 8 (the position of the substrate stage 10 in another aspect).

A distortion of an image projected onto the substrate 8 by a projection optical system 7 can be corrected by controlling the aberration of the projection optical system 7. Hence, a controller 15 controls a distortion of an image projected onto the substrate 8 by driving an optical element 71 included in the projection optical system 7, thereby correcting a distortion of an image to be finally transferred onto the substrate 8. The controller 15 also controls the wavelength of light which illuminates the original 6 (the wavelength of light emitted by the light source 1), thereby correcting a distortion of an image to be finally transferred onto the substrate 8.

A distortion of an image projected onto the substrate 8 can be decomposed into various kinds of components such as components proportional to the first power of the distance from the exposure center and those proportional to the third power of that distance. The controller 15 corrects a distortion of an image to be finally transferred onto the substrate 8 by controlling these components by at least one of the driving of the optical element 71 and the control of the wavelength of light which illuminates the original 6, as described above.

A practical example will be given below. In scanning exposure, let ($x_c$, $y_c$) be the center coordinate position in a region where slit-shaped exposure light enters, A be the acceleration of the substrate stage 10 during exposure in that region, and D($x_c$, $y_c$, A) be the distortion of an image formed on the substrate 8 by this exposure. The distortion D($x_c$, $y_c$, A) can then be decomposed into components $D_1$, $D_2$, ..., $D_n$:

$$D(x_c,y_c,A) = D_1(x_c,y_c,A) + D_2(x_c,y_c,A) + \ldots + D_n(x_c,y_c,A) \quad (3)$$

Using the components $D_1, D_2, \ldots, D_n$ as correction values, the controller 15 corrects a distortion of an image to be finally transferred onto the substrate 8 by optically controlling an image projected onto the substrate 8 by at least one of the driving of the optical element 71 and the control of the wavelength of light which illuminates the original 6.

The center coordinate position $(x_c, y_c)$ and the position $(x, y)$ of the substrate stage 10 satisfy a relation:

$$(x_c, y_c) = (x+\alpha, y+\beta) \quad (4)$$

where $\alpha$ and $\beta$ are constants.

Hence, equation (3) is a function of the position $(x, y)$ and acceleration A of the substrate stage 10. Note that when the sensitivities of the correction values to the position $(x, y)$ of the substrate stage 10 are lower than a tolerance, the correction values may be given as functions of only the acceleration A.

Figure 7:
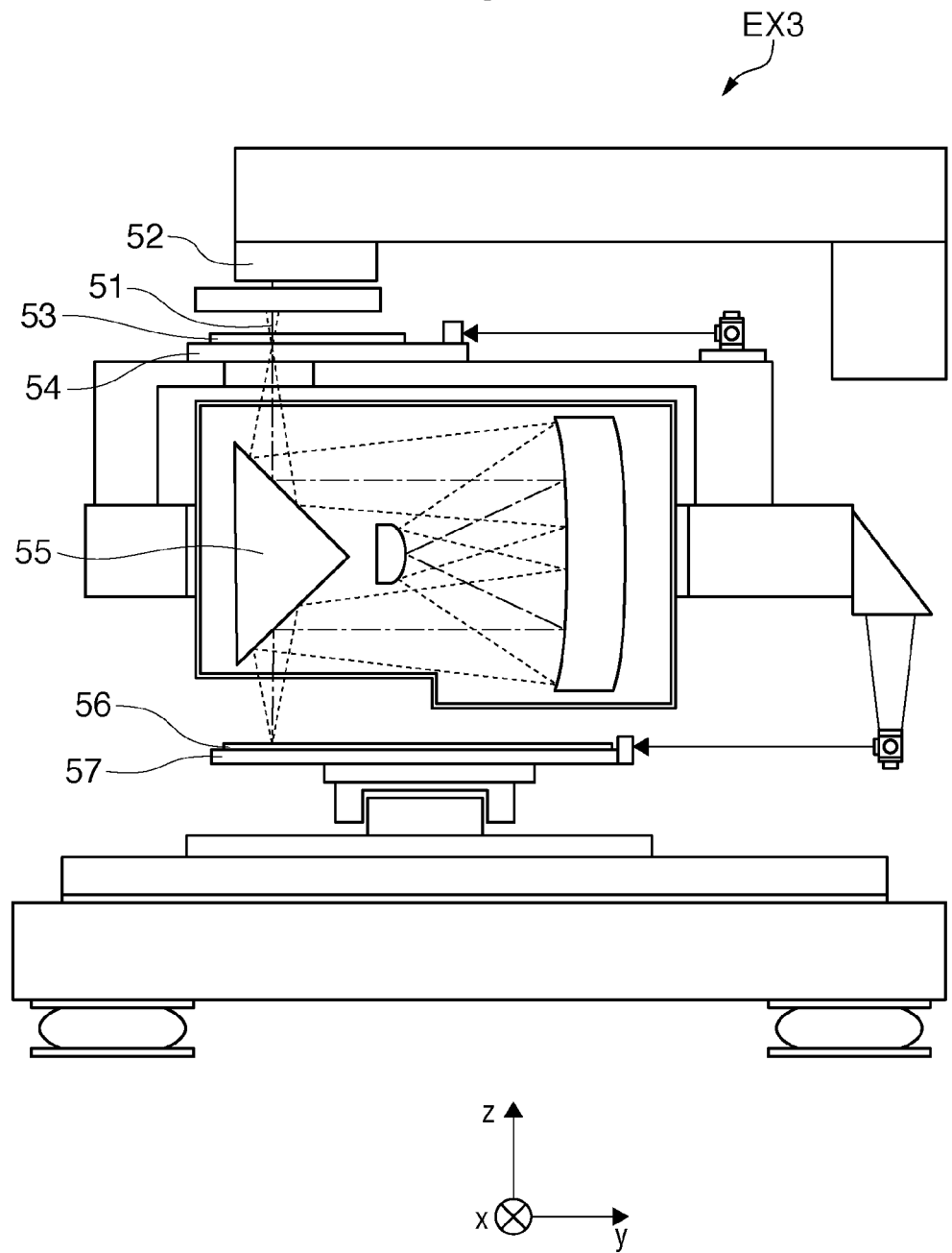
FIG. 7 is a view showing the schematic arrangement of a scanning exposure apparatus according to the third embodiment of the present invention.

FIG. 7 is a view showing the schematic arrangement of a scanning exposure apparatus according to the third embodiment of the present invention. Note that details which are not particularly referred to in the third embodiment can be the same as in the first or second embodiment. An exposure apparatus EX3 according to the third embodiment of the present invention is a scanning exposure apparatus of the mirror projection scheme. The above-mentioned correction of an image distortion is also applicable to a scanning exposure apparatus of the mirror projection scheme.

An illumination optical system 52 illuminates an original 53 with a light beam 51. An image of the pattern of the original 53 is projected onto a substrate 56 via a mirror optical system 55 serving as a projection optical system. With this operation, an image is formed on the substrate 56. An original stage 54 holds the original 53, and a substrate stage 57 holds the substrate 56. The original 53 and substrate 56 are scanned synchronously.

[Device Manufacturing Method]

A device manufacturing method according to an embodiment of the present invention can be used to manufacture devices such as a semiconductor device and a liquid crystal device. The method can include a step of exposing a substrate coated with a photosensitive agent using the above-mentioned scanning exposure apparatus, and a step of developing the exposed substrate. The device manufacturing method can also include known subsequent steps (e.g., oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-294905, filed Nov. 18, 2008, which is hereby incorporated by reference herein in its entirety.

What is claimed is:

1. An apparatus which includes an original stage that holds an original, a substrate stage that holds a substrate, and a projection optical system that projects a pattern of the original onto the substrate, and which scans and exposes the substrate during a period in which the speeds of the original stage and the substrate stage change, the apparatus comprising:

a controller configured to correct, a distortion generated in an image transferred onto the substrate due to at least one of deformation of the original stage in response to a change in speed of the original stage and deformation of the substrate stage in response to a change in speed of the substrate stage, based on a correction value determined by an acceleration and a position of the substrate stage, wherein the controller corrects the distortion of the image transferred onto the substrate by controlling, a distortion of the image projected onto the substrate by the projection optical system, based on the correction value.

2. The apparatus according to claim 1, wherein the controller controls the distortion by driving an optical element in the projection optical system.

3. The apparatus according to claim 1, wherein the controller controls the distortion by controlling a wavelength of light which illuminates the original.

4. The apparatus according to claim 1, wherein the apparatus scans and exposes the substrate also during a period in which speeds of the original stage and the substrate stage are constant.

5. A method comprising:

exposing a substrate using an apparatus; and developing the substrate, wherein the apparatus includes an original stage that holds an original, a substrate stage that holds a substrate, and a projection optical system that projects a pattern of the original onto the substrate, and which scans and exposes the substrate during a period in which the speeds of the original stage and the substrate stage change, the apparatus comprising:

a controller configured to correct, a distortion generated in an image transferred onto the substrate due to one of deformation of the original stage in response to a change in speed of the original stage and deformation of the substrate stage in response to a change in speed of the substrate stage, based on a correction value determined by an acceleration and a position of the substrate stage, wherein the controller corrects the distortion of the image transferred onto the substrate by controlling, a distortion of the image projected onto the substrate by the projection optical system, based on the correction value.

6. The method according to claim 5, wherein the controlling the distortion includes driving an optical element in the projection optical system.

7. The method according to claim 5, wherein the controlling the distortion includes controlling a wavelength of light which illuminates the original.

8. The method according to claim 5, wherein the apparatus scans and exposes the substrate also during a period in which speeds of the original stage and the substrate stage are constant.

* * * * *